United States Patent
Brox et al.

(10) Patent No.: US 11,531,632 B2
(45) Date of Patent: Dec. 20, 2022

(54) MULTI-LEVEL RECEIVER WITH TERMINATION-OFF MODE

(71) Applicant: Micron Technology, Inc., Boise, ID (US)

(72) Inventors: Martin Brox, Munich (DE); Wolfgang Anton Spirkl, Germering (DE); Thomas Hein, Munich (DE); Michael Dieter Richter, Ottobrunn (DE); Peter Mayer, Neubiberg (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/464,021

(22) Filed: Sep. 1, 2021

(65) Prior Publication Data
US 2022/0058143 A1 Feb. 24, 2022

Related U.S. Application Data

(63) Continuation of application No. 16/579,362, filed on Sep. 23, 2019, now Pat. No. 11,113,212.

(Continued)

(51) Int. Cl.
*G06F 13/16* (2006.01)
*G06F 13/40* (2006.01)
(Continued)

(52) U.S. Cl.
CPC ...... *G06F 13/1668* (2013.01); *G06F 13/4086* (2013.01); *G11C 11/221* (2013.01); *G11C 11/4093* (2013.01)

(58) Field of Classification Search
CPC ............. G06F 13/1668; G06F 13/4086; G11C 11/221; G11C 11/2273; G11C 11/2275;
(Continued)

(56) References Cited

U.S. PATENT DOCUMENTS 9,237,047 B1 * 1/2016 Zhang .................... H04L 27/06
9,432,298 B1    8/2016 Smith
(Continued)

FOREIGN PATENT DOCUMENTS

| CN | 1890913 A | 1/2007 |
|---|---|---|
| CN | 104322026 A | 1/2015 |

(Continued)

OTHER PUBLICATIONS

ISA/KR, International Search Report and Written Opinion of the International Searching Authority, Int'l. Appl. No. PCT/US2019/054331, dated Jan. 17, 2020, Korean Intellectual Property Office, Seo-gu, Daejeon, Republic of Korea, 13 pgs.

(Continued)

*Primary Examiner* — Yong J Choe
(74) *Attorney, Agent, or Firm* — Holland & Hart LLP

(57) ABSTRACT

Methods, systems, and devices for multi-level receivers with various operating modes (e.g., on-die termination mode, termination-off mode, etc.) are described. Different modes may be utilized for receiving different types of signaling over a channel. Each mode may correspond to the use of a respective set of receivers configured for the different types of signaling. For example, a device may include a first set of receivers used to receive a first type of signal (e.g., with the channel being actively terminated) and a second set of receivers used to receive a second type of signal (e.g., with the channel being non-terminated). When communicating with another device, based on the type of signaling used for communications, either the first set of receivers or the second set of receivers may be enabled (e.g., through selecting a receiver path for the corresponding mode).

20 Claims, 8 Drawing Sheets

Related U.S. Application Data

(60) Provisional application No. 62/749,468, filed on Oct. 23, 2018.

(51) Int. Cl.
*G11C 11/4093* (2006.01)
*G11C 11/22* (2006.01)

(58) Field of Classification Search
CPC ............ G11C 11/2293; G11C 11/4093; G11C 11/5657; G11C 7/1084
See application file for complete search history.

(56) References Cited

U.S. PATENT DOCUMENTS

| | | |
|---|---|---|
| 2003/0001760 A1 | 1/2003 | Coene |
| 2006/0067141 A1 | 3/2006 | Perego et al. |
| 2006/0107154 A1 | 5/2006 | Bansal et al. |
| 2006/0170453 A1 | 8/2006 | Zerbe et al. |
| 2011/0004726 A1 | 1/2011 | Haukness et al. |
| 2012/0183303 A1 | 7/2012 | Onohara et al. |
| 2018/0287829 A1 | 10/2018 | Stojanovic et al. |

FOREIGN PATENT DOCUMENTS

| | | |
|---|---|---|
| CN | 103988442 B | 8/2016 |
| CN | 107210754 A | 9/2017 |

OTHER PUBLICATIONS

European Patent Office, "Extended Search Report," issued in connection with European Patent Application No. 19876197.5, dated Jan. 28, 2022 (10 pages).

Min, K., et al., "0.5-4.4 Gbit/s PAM4/NRZ dual-mode transceiver with 0.6 V near-ground NMOS driver for low-power memory interface," Electronics Letters, vol. 54, No. 11, May 31, 2018 (pp. 684-685).

China Patent Office, "Office Action (sometimes Decision of Rejection, etc. depending on country)," issued in connection with China Patent Application No. 201980075923.4, dated Nov. 16, 2021 (10 pages).

\* cited by examiner

MULTI-LEVEL RECEIVER WITH TERMINATION-OFF MODE

CROSS REFERENCE

The present Application for Patent is a continuation of U.S. patent application Ser. No. 16/579,362 by Brox et al., entitled "MULTI-LEVEL RECEIVER WITH TERMINATION-OFF MODE," filed Sep. 23, 2019, which claims priority to U.S. Provisional Patent Application No. 62/749,468 by Brox et al., entitled "MULTI-LEVEL RECEIVER WITH TERMINATION-OFF MODE," filed Oct. 23, 2018, each of which is assigned to the assignee hereof and is expressly incorporated by reference in its entirety.

BACKGROUND

The following relates generally to a system that includes at least one memory device and more specifically to a multi-level receiver with a termination-off mode.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Memory devices may include various channels for communicating information with other devices (e.g., a controller) within a system. Procedures used to select receivers of a device to ensure that data is effectively and efficiently received from other devices are desired.

DETAILED DESCRIPTION

Figure 1:
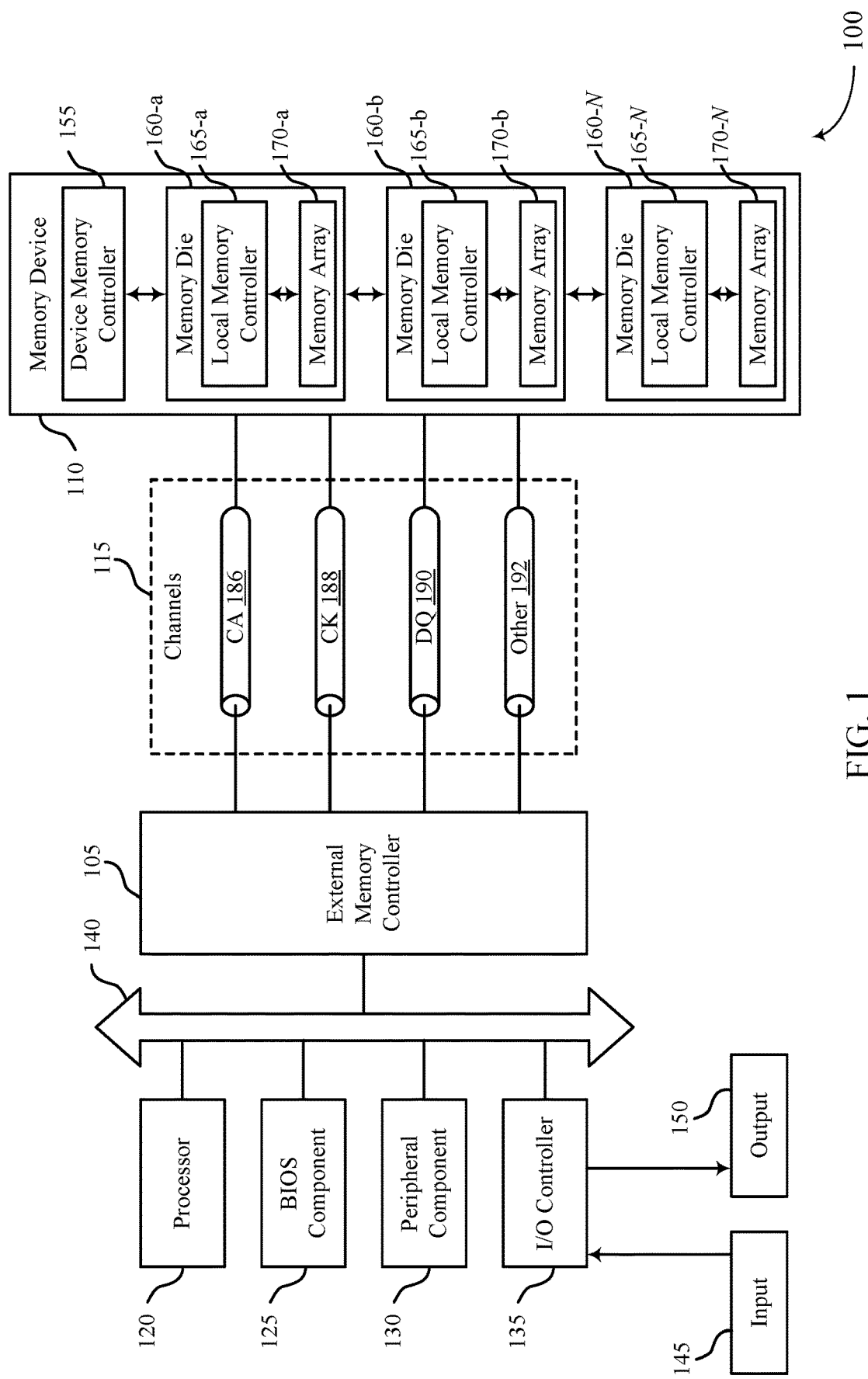
FIG. 1 illustrates an example of a system that supports a multi-level receiver with a termination-off mode as described herein.

A memory device may communicate with another device (e.g., a host device for the memory device such as a graphics processing unit (GPU), general purpose GPU (GPGPU), central processing unit (CPU), or other device) over one or more communications channels using different types of signaling. Such a channel may couple a pin of the memory device with a pin of the other device. For example, the channel may be a data channel and may couple a data pin (e.g., a data (DQ) pin) of the memory device with a corresponding pin of the other device. The channel may be unidirectional or bi-directional, and the memory device may act as a transmitting device for some access operations (e.g., for read operations) or as a receiving device for some access operations (e.g., for write operations), or both, with the other device correspondingly acting as a receiving device or a transmitting device for some access operations.

In some cases, data communicated over the channel may be sent using multi-level signaling (e.g., signals modulated according to a scheme that includes (3) three or more levels, such as pulse amplitude modulation (PAM) having four (4) symbols (PAM4)) or using binary-level signaling (e.g., signals modulated according to a scheme that includes two (2) levels, such as non-return-to-zero (NRZ)). Additionally, the multi-level signaling may be associated with high-bandwidth communications using an active termination of the channel, where the binary-level signaling may not use a terminated channel and may be associated with low-speed communications and low-power consumption. A system may thus benefit from the throughput provided by terminated multi-level signaling, while also gaining the advantages of reduced power consumption provided by unterminated binary-level signaling.

As disclosed herein, it may be desirable to provide an unterminated operation mode for binary signaling within a system that simultaneously utilizes multi-level signaling. The unterminated mode may enable decreased power consumption by a memory system since the overhead of a termination current and a current to create, for example intermediate voltage levels, may be avoided. In addition, a terminated mode may enable high-throughput communications using multi-level signaling. As such, a receiver system may be partitioned into multiple types of receivers used to receive the different types of signaling in accordance with a selected mode.

For example, one set of receivers may be configured for multi-level signaling using a high-performance mode, and another set of receivers may be configured for binary-level signaling in a low-performance mode that consumes relatively less power. Through the use of these different modes, devices in a memory system may differentiate between different types of signals used to communicate over the channel. Further, the different sets of receivers of the receiver system may be separately adjusted. For instance, a set of receivers associated with multi-level signaling may be adjusted for speed and voltage sensitivity (e.g., using offset calibration techniques), where a set of receivers associated with binary-level signaling may be adjusted for reduced power consumption.

Figure 2:
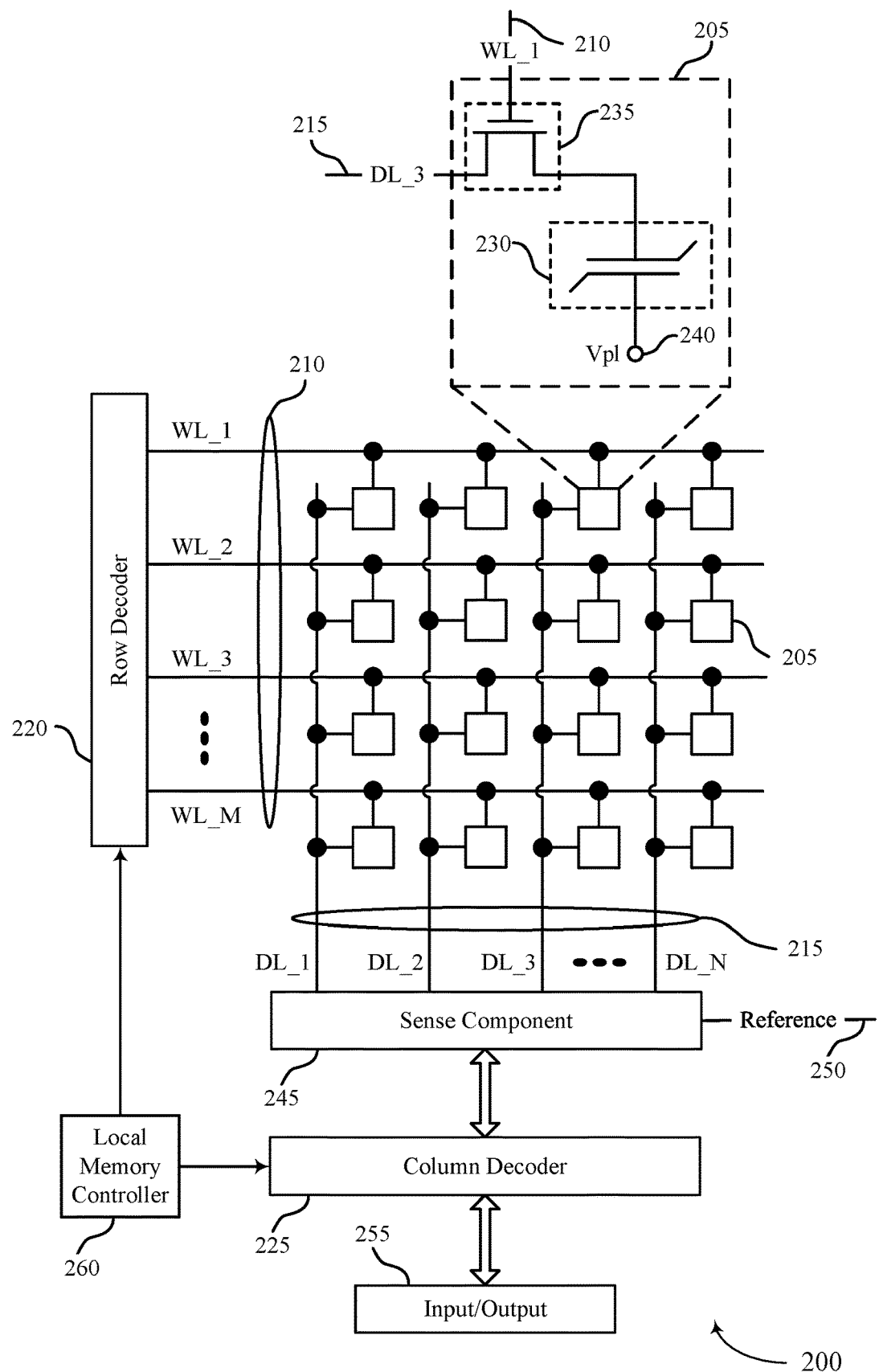
FIG. 2 illustrates an example of a memory die that supports a multi-level receiver with a termination-off mode as described herein.

Features of the disclosure are described herein at an exemplary memory system level in the context of FIG. 1 and are further described with regard to an exemplary memory device in the context of FIG. 2. Examples of eye diagrams for different types of signals are provided in FIGS. 3A and 3B, and an exemplary memory system is then described in FIG. 4. In addition, a receiver system configured with different sets of receivers for respective types of signaling is described in the context of FIG. 5. These and other features of the disclosure are further illustrated by and described with reference to a block diagram and flowchart of FIGS. 6 and 7, respectively, that relate to multi-level receivers with a termination-off mode to achieve enhance communications efficiency in memory systems.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. A memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a CPU, a GPU, a GPGPU, or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions disclosed herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some examples, the external memory controller 105 may use different types of signaling for an access operation. For instance, an access operation (e.g., corresponding to a high-speed data transfer rate, such as a 3D game or other processor-intensive operations) may utilize a first signaling type with a modulation scheme that supports a bandwidth parameter of the first access operation. Likewise, a different access operation (e.g., a read or write operation performed while a device is not performing complex computations) may use a second signaling type that may be beneficial for power savings at the device. In either case, the external memory controller 105 may determine which type of signaling may be used for respective access operations. The external memory controller 105 may also determine a corresponding mode for each type of signaling, where a first mode may enable (e.g., at the external memory controller 105, or the memory device 110, or both) a set of receivers configured to receive the first signaling type and a second mode may enable (e.g., at the external memory controller 105, or the memory device 110, or both) another set of receivers configured to receive the second signaling type. An access operation may be performed using the set of receivers that correspond to the type of signaling being sent over the channel, while the unused set of receives may be disabled, thereby providing power savings.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120). The device memory controller 155 or the local memory controller 165 may enable different sets of receivers at the memory device 110. For instance, based on a particular mode selected by the external memory controller 105, the device memory controller 155 or the local memory controller 165 may determine which mode (and which signaling type) is used for an access operation (e.g., a write operation) and may enable a corresponding set of receivers.

The components of the system 100 may exchange information with the memory device 110 using a plurality of channels 115. The channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may comprise a conductive line that is electrically terminated. For instance, a device (e.g., the memory device 110, the external memory controller 105) coupled with a channel 115 may include components that match the characteristic impedance of a conductive line corresponding to the channel. As an example, a component (e.g., at the end of a conductive line) may include a set of resistors (e.g., terminating resistors) to match the impedance of the line to prevent signals from reflecting back toward a transmitting device and causing interference. In some cases, a voltage of the component may be held at a constant value to achieve an active electrical termination of the conductive line. In some cases, the external memory controller 105 may control the active termination of one or more channels 115 within the system 100. The termination of the one or more channels 115 may be referred to as on-die termination. In other cases, the channels 115 may comprise un-terminated conductive lines, which may be based on the type of signaling transmitted over a channel 115.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more DQ channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4). In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, it may be beneficial for a device to utilize different types of signals provided by respective modulation schemes. For instance, while multi-level modulation schemes may be associated with increased throughput for data communicated between the external memory controller 105 and the memory device 110, binary-level modulation may be associated with lower power consumption relative to multi-level signaling. Further, multi-level signaling may be associated with actively terminated transmission lines used to communicate data between devices, whereas binary-level signaling may be associated with non-terminated lines providing larger data eyes relative to signaling sent using terminated transmission lines. As such, a receiver system that is configured to receive different types of signals on channels 115 using different termination states may provide enhanced communications between devices and allow dynamic switching between high-throughput and power-saving modes.

As described herein, system 100 may support the use of receiver circuitry that includes a first set of receivers for a first type of signaling (e.g., multi-level signaling) and a second set of receivers for a second type of signaling (e.g., binary-level signaling). A device may enable these different sets of receivers based on different signaling modes, where the signaling mode may be indicative of the type of signaling used to communicate (and the corresponding set of receivers to enable). As an example, an external memory controller 105 may identify a high-speed access operation that is to utilize multi-level signaling on an actively terminated channel. The external memory controller 105 may transmit, to a memory device 110, a command to execute the access operation (e.g., a write operation), and the external memory controller 105 may additionally transmit a bit to the memory device 110 that indicates a first mode corresponding to the multi-level signaling. The memory device 110 may determine the type of signaling from the received bit and accordingly enable the first set of receivers to receive data over the channel 115 during the write operation, where the channel 115 may be actively terminated. Additional access operations may be performed under the same mode.

At some later time, the external memory controller 105 may no longer need to perform high-speed access operations, and may switch to binary-level signaling for communicating data to the memory device 110, for example, to conserve battery power. As such, the external memory controller 105 may transmit a command to perform another write operation and another bit that indicates a second mode corresponding to the binary-level signaling. The memory device 110 may again determine the type of signaling for the write operation and enable a second set of receivers to receive data over the channel 115 during the write operation, where the channel 115 may be unterminated. The memory device may thus utilize a same receiver system having different types of receivers configured for respective types of signaling, and may use different modes to select a corresponding receiver path for the type of signaling (and corresponding transmission line termination) being used for an access operation.

It is noted that the above example is not limited to receiver path selection at a memory device 110. Other devices, such as the external memory controller 105, may adaptively select different receiver paths for different types of signaling in accordance with different modes. That is, the receiver selection operations described as performed by a memory device 110 may also be performed by an external memory controller 105, and vice versa. For instance, the external memory controller 105 may determine a mode corresponding to a type of signaling used (e.g., based on a running application, or a bandwidth parameter for the read operation, or both) and may store a bit indicative of the mode. The memory device 110 may transmit signaling to the external memory controller 105 based on the selected mode, and the external memory controller 105 may select a receiver path that enables a set of receivers configured for corresponding type of signaling.

By utilizing a receiver system with various partitions dedicated to different types of signaling, a device may dynamically receive data modulated according to different modulation schemes that may be associated with different termination schemes on a channel, and that each provide various advantages. As an example, using an unterminated channel for low-speed (and low-power) access operations may enable a receiver to more accurately identify data received on a channel due to the size of a data eye. Alternatively, high-speed access operations may be achieved through the use of multi-level signaling over a terminated channel. By utilizing different receiver paths of a same receiver system (e.g., coupled with a same channel 115) for these different types of signaling, the system 100 achieves enhanced communications that provide accurate and efficient data reception, power savings, and the ability to transfer data at high speed.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may perform functions to select different receiver paths for receiving data (e.g., for writing to the one or more memory cells 205). As an example, receivers of the memory die 200 may be configured for respective types of signaling sent over a channel and may be used to receive data from an external memory controller 105. As such, the local memory controller 260 may determine a mode that is associated with a particular type of signaling and may enable a set of receivers utilized for a particular type of signaling. In some cases, a bit (e.g., a mode register bit) may indicate to the local memory controller 260 which mode is being used for an access operation, where the bit may indicate signaling (e.g., enable signaling) the local memory controller 260 is to send to enable a set of receivers corresponding to a selected mode.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. In some cases, different modes may enable some receiver paths for receiving, from a controller, for writing to the one or more memory cells 205. In some aspects, a write operation may be configured with a type of signaling (e.g., PAM4 signaling, NRZ signaling) used to send data to the memory die 200, and the local memory controller 260 may select a corresponding set of receivers based on the type of signaling (and an associated mode).

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some cases, an external memory controller 105 may enable a set of receivers (e.g., through a particular receiver path) based on the type of signaling used to transmit data from the memory die 200 as part of the read operation. For instance, the external memory controller 105 may configure a type of signaling (e.g., PAM4 signaling, NRZ signaling)

for the read operation and may accordingly receive such signaling over a channel 115. As such, a set of receivers may be configured at the external memory controller 105 for the type of signaling used to communicate the data sensed at one or more memory cells 205 to the external memory controller 105 during the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
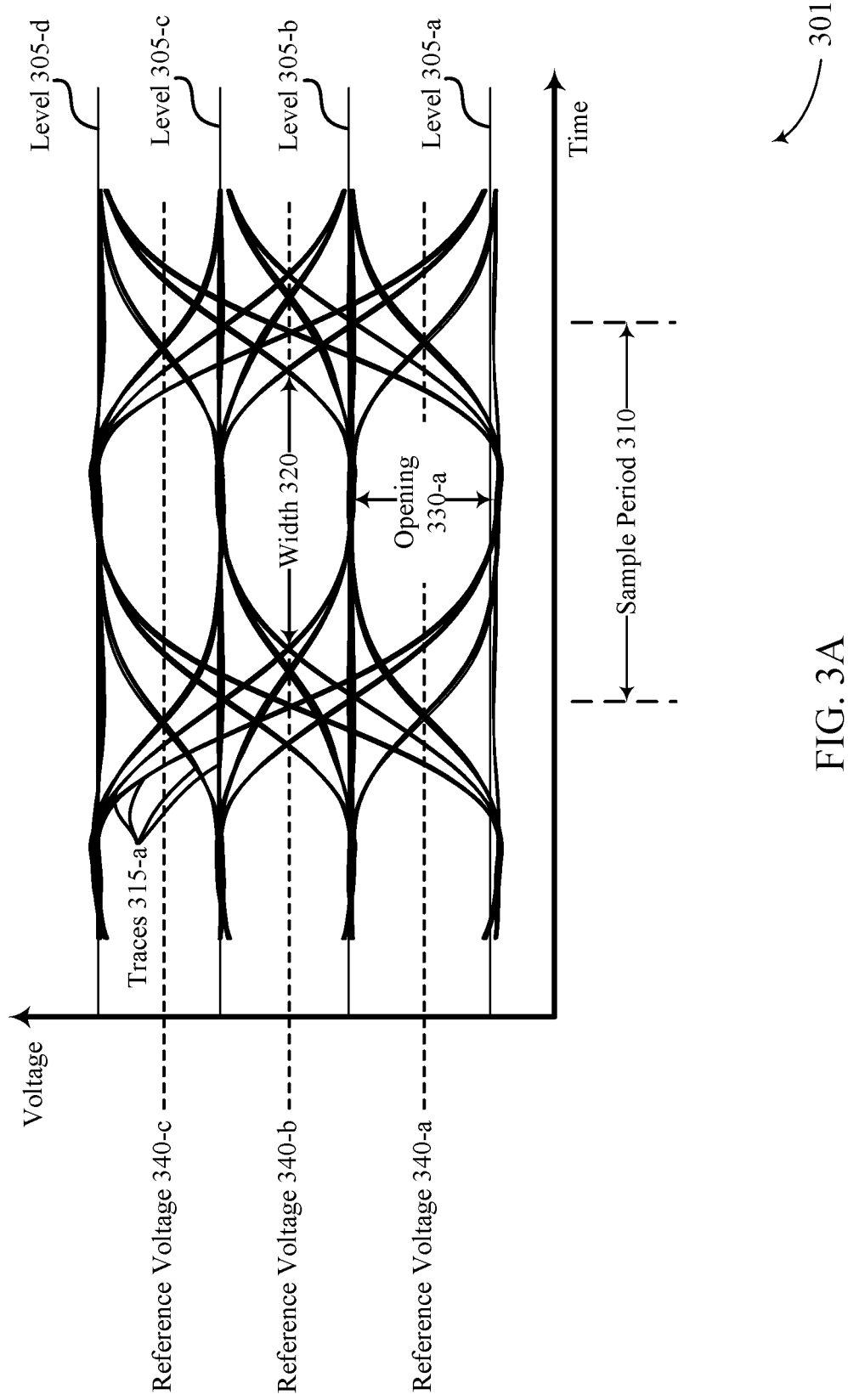
FIG. 3A illustrates an example of an eye diagram that supports a multi-level receiver with a termination-off mode as described herein.
Figure 3B:
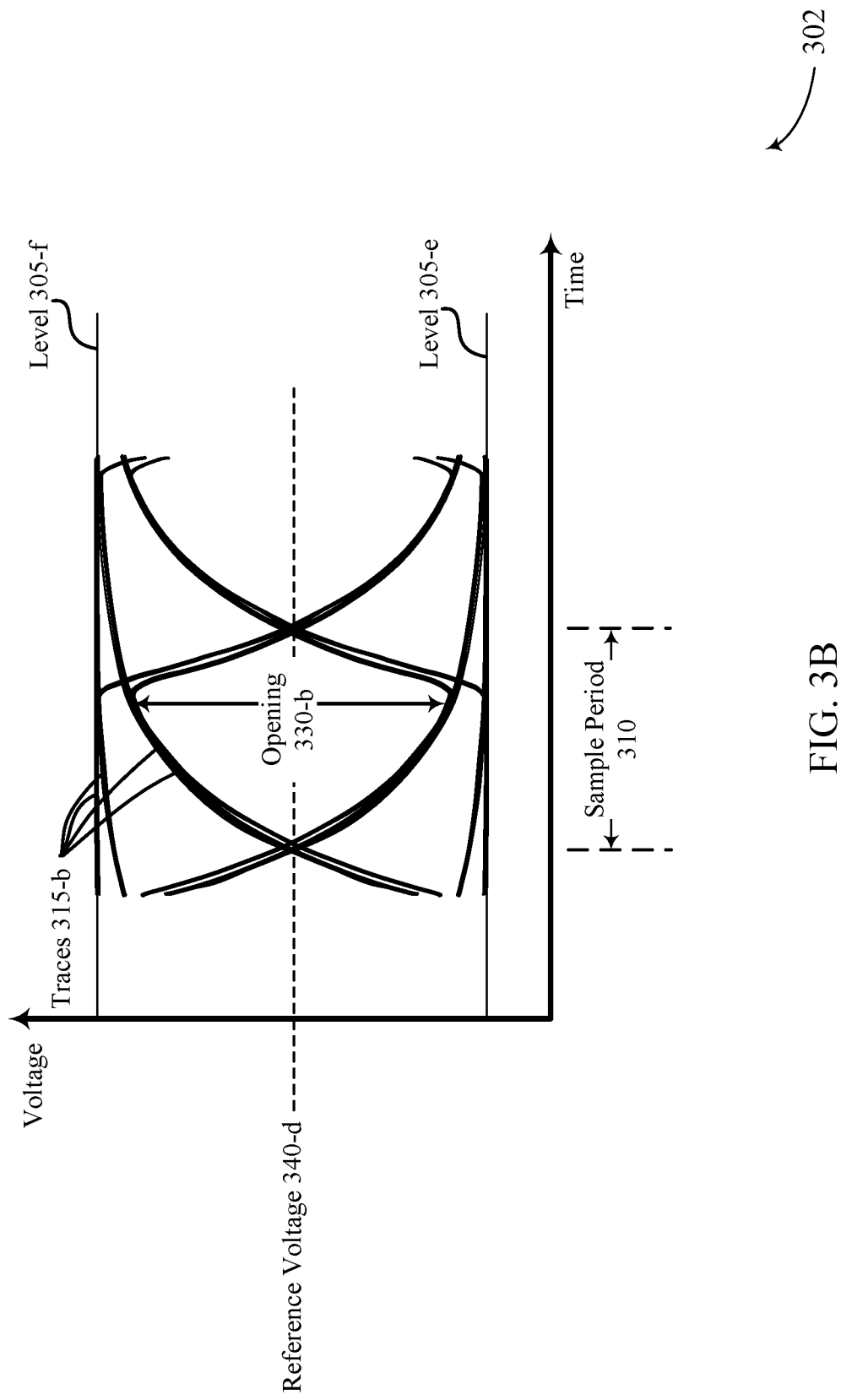
FIG. 3B illustrates an example of another eye diagram that supports a multi-level receiver with a termination-off mode as described herein.

FIGS. 3A and 3B illustrate examples of eye diagrams 301 and 302, respectively, that support a multi-level receiver with a termination-off mode as disclosed herein. The eye diagrams 301 and 302 may depict overlaid data transmissions and may illustrate implementation of aspects of system 100 and memory die 200, as described with reference to FIGS. 1-2. The eye diagram 301 may represent a signal modulated according to a scheme that includes three or more levels 305 (e.g., a multi-level signal).

For instance, the eye diagram 301 may be used to indicate the quality of signals in high-speed transmissions and may represent four symbols of a signal (e.g., '00', '01', '10', and '11'). Each of the four symbols may be represented by a different voltage amplitude (e.g., voltage levels 305-a, 305-b, 305-c, and 305-d). In other examples, the eye diagram 301 may represent a PAM signal (e.g., a PAM4 signal) that may be used to communicate data in a memory device (such as a memory device 110 as described with reference to FIG. 1). The eye diagram 301 may be used to provide a visual indication of the health and integrity of a signal and may further indicate noise margins of the data signal. The noise margin may, for example, refer to an amount by which the signal exceeds the ideal boundaries of the voltage levels 305. In the present example, the eye diagram 301 illustrates four distinct voltage levels 305 (e.g., first voltage level 305-a, second voltage level 305-b, third voltage level 305-c, and fourth voltage level 305-d) or symbols that may be communicated (e.g., across a conductor), for example, using PAM4 signaling.

To generate the eye diagrams 301 and 302, an oscilloscope or other computing device may sample a digital signal according to a sample period 310 (e.g., a unit interval or a bit period). The sample period 310 may be defined by a clock associated with the transmission of the measured signal. The oscilloscope or other computing device may measure the voltage level of the signal during the sample period 310 to form a trace 315. Noise and other factors may result in the traces 315 measured from the signal deviating from a set of ideal step functions. By overlaying multiple traces 315, various characteristics about the measured signal may be determined. For example, the eye diagrams 301 and 302 may be used to identify different characteristics of a communication signals such as jitter, cross talk, distortion, electromagnetic interference (EMI), signal loss, signal-to-noise ratio (SNR), other characteristics, or combinations thereof. A closed eye may indicate a noisy and/or unpredictable signal.

An 'eye' of the eye diagrams 301 and 302 may refer to the space between the traces 315 and may include a width, such as width 320, and an opening, such as opening 330. With respect to the eye diagram 301, as the signals converge toward one of the multiple voltage levels 305-a through 305-d, the areas between the voltage levels 305-a through 305-d that are devoid of traces 315 may thus be referred to as eyes of the eye diagram 301. Each eye in an eye diagram may have a unique width 320 based on the characteristics of the measured signal. Various encoding and decoding techniques may be used to modify the width 320 of the measured signal.

To distinguish between different voltage levels 305 when decoding a signal, respective reference voltages 340 may be located between the different voltage levels 305 represented by the traces 315. For example, a low-level reference voltage 340-a may be positioned between the first voltage level 305-a and the second voltage level 305-b; a mid-level reference voltage 340-b may be positioned between the second voltage level 305-b and the third voltage level 305-c; and a high-level reference voltage 340-c may be positioned between the third voltage level 305-c and fourth voltage level 305-d. When decoding, the signals represented by the traces may be compared to the reference voltages 340 at a sampling time that may occur near the middle of the sample period 310. The smaller the eye associated with each reference voltage, the more likely that errors may be introduced into the detection. As such, the receiver may ideally use a minimum voltage difference (with respect to a reference voltage 340) to distinguish whether a particular signal is higher or lower than the reference voltage 340. But in reality, the data eye may be smaller, for example, due to cross coupling, noise, unstable voltages, and the like. An error (e.g., an incorrect value) may thus be detected if a signal meant to convey the first voltage level 305-a settles above the low-level reference voltage 340-a or inadvertently crosses above the low-level reference voltage 340-a when a sampling time occurs. As a result, the receiver may determine that the second voltage level 305-b was signaled, when in fact the first voltage level 305-a was signaled.

In some cases, the eye diagram 301 may represent multi-level signaling over a ground-terminated transmission line. For example, the three data-eyes of eye diagram 301 may be centered around levels the reference voltage levels 340, and the first voltage level 305-a may be held at or near zero Volts. As such, a device receiving such signaling may have to resolve relatively small voltages (e.g., on the order of tens of millivolts), where the absolute voltage between the first voltage level 305-a and the fourth voltage level 305-d may also be relatively small (e.g., on the order of a few hundred millivolts) compared to other types of modulation schemes, or other schemes that are not ground-terminated. While such multi-level modulation schemes and associated termination may support high-speed data transmissions, these schemes may not be efficient for low-speed data transmissions, particularly in cases where power consumption of a device (such as a mobile device powered by a battery) is desired to be kept at a minimum.

The eye diagram 302 of FIG. 3B may represent a signal modulated according to a scheme that includes two voltage levels 305 (e.g., a binary-level signal). The eye diagram 302 may be used to indicate the quality of signals in low-speed transmissions and may represent two symbols of a signal (e.g., '0' and '1'). Each of the two symbols may be represented by a different voltage amplitude (e.g., voltage levels 305-*e* and 305-*f*). In other examples, the eye diagram 302 may represent a binary-level signal (e.g., an NRZ signal) that may be used to communicate data in a memory device (such as a memory device 110 as described with reference to FIG. 1). In addition, the binary-level singling represented by the eye diagram 302 may correspond to data transmissions over an unterminated transmission line. For instance, NRZ signaling may be transmitted over a channel without an active termination.

Similar to the eye diagram 301, when decoding, the signals represented by traces 315-*b* may be compared to a reference voltages 340-*d* at a sampling time that may occur near the middle of the sample period 310. However, as can be observed by the eye diagram 302, an opening 330-*b* and overall size of an eye for unterminated binary-level signaling may be relatively larger than the opening 330-*a* and the eyes for the multi-level signaling of eye diagram 301. The relatively larger eye associated with binary-level signaling may thus provide for less stringent resolutions parameters for identifying correct values of a received signal (as compared to multi-level signaling). Further, the overhead of a termination current to create, for example, intermediate PAM4 levels (e.g., second voltage level 305-*b* and third voltage level 305-*c*) may be avoided through the use of the unterminated binary-level signaling of eye diagram 302. As such, binary-level signaling may be associated with lower power consumption than multi-level signaling, and may be ideal for use when data may not need to be communicated with a memory device at high speed (e.g., based on currently running applications) and for minimizing power consumption.

As discussed herein, a device may include a receiver system that is configured to receive various types of signals modulated according to different modulation schemes, such as NRZ and PAM4 signals. The device may selectively switch between the different modulation/signaling types based on, for example, a bandwidth parameter of an application or an access operation. The device may also include different receiver types within the same receiver system to provide for efficient reception of the different types of signaling, where the use of one type of receiver or another may be controlled by respective modes that are indicative of the type of signaling being used.

Figure 4:
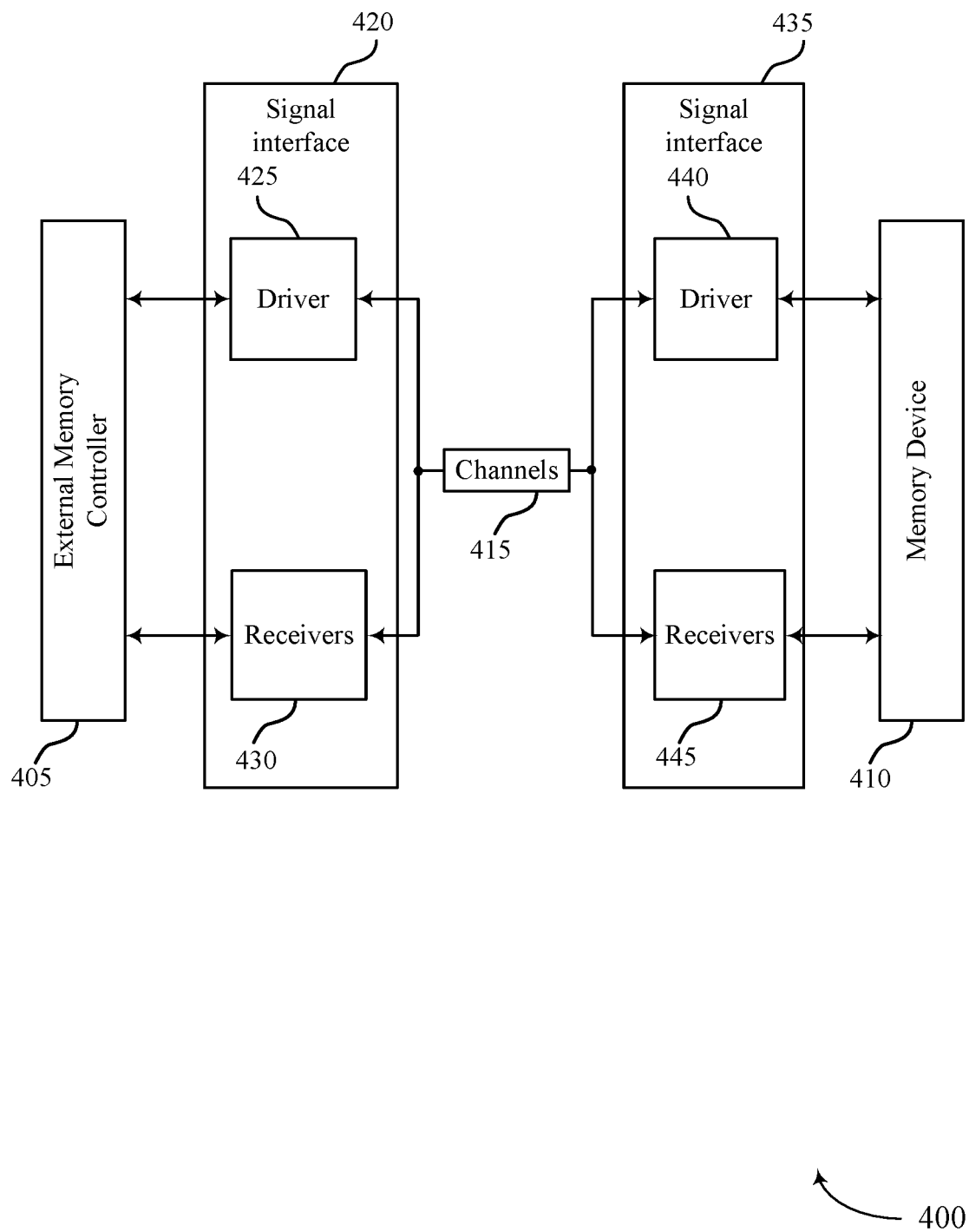
FIG. 4 illustrates an example of a memory system that supports a multi-level receiver with a termination-off mode as described herein.

FIG. 4 illustrates an example of a memory system 400 that supports a multi-level receiver with a termination-off mode as disclosed herein. The memory system 400 may include an external memory controller 405, a memory device 410, channels 415, a first signaling interface 420, and a second signaling interface 435. The external memory controller 405, channels 415, and memory device 410 may be examples of aspects of external memory controller 105, channels 115, and memory device 110 or memory die 200 of FIGS. 1 and 2, respectively. In some cases, the memory system 400 may support the use of different modes (e.g., a first mode that utilizes active termination for a channel and a second mode that does not utilize active termination of the channel) that correspond to different types of signaling communicated between the external memory controller 405 and the memory device 410.

The first signaling interface 420 may generate and/or decode signals communicated using the plurality of channels 415. In some cases, the first signaling interface 420 may be associated with each component that is coupled with channels 415. The first signaling interface 420 may be configured to generate and/or decode multi-level signals, binary signals, or both (e.g., simultaneously). In some cases, first signaling interface 420 may be included within external memory controller 405.

In some cases, the first signaling interface 420 may be configured to selectively generate and/or decode different types of signals (e.g., NRZ signals, PAM4 signals, PAM8 signals, etc.). Different types of signals may be used based on the operational circumstances of the memory system 400. For example, binary signaling may use less power than multi-level signaling and may be used when power consumption is a driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the first signaling interface 420 may be configured to implement coding functions such as error detection procedures, error correction procedures, data bus inversion procedures, or combinations thereof. The first signaling interface 420 may include a first driver 425 and receivers 430.

The first driver 425 may be configured to generate a multi-level signal based on a logic state that includes multiple bits. For example, the first driver 425 may use PAM signaling techniques to generate a signal having an amplitude that corresponds to the logic state. The first driver 425 may be configured to receive data using a single input line. In some cases, the first driver 425 may include a first input line for a first bit of data (e.g., most-significant bit) and a second input line for a second bit of data (e.g., least-significant bit). In some circumstances, the first driver 425 may be configured to generate a binary signal (e.g., an NRZ signal). The first driver 425 may be referred to as a multi-leg driver. In some examples, the first driver 425 includes an operational amplifier.

The receivers 430 may include one or more receivers configured to determine a logic state represented by the multi-level signal received using the plurality of channels 415. For example, the receivers 430 may include a set of receivers configured to determine an amplitude of the received multi-level signal. Based on the determined amplitude, the receivers 430 may determine the logic state represented by the multi-level signal. The receivers 430 may be configured to output data using a single output line. In some cases, receivers 430 may include a first output line for a first bit of data (e.g., most-significant bit) and a second output line for a second bit of data (e.g., least-significant bit). Additionally, the receivers 430 may include a set of receivers configured to decode a binary signal (e.g., an NRZ signal).

The second signaling interface 435 may be similarly configured to and operate similarly as the first signaling interface 420. In some cases, the second signaling interface may be included in the memory device 410. The second signaling interface 435 may include a second driver 440 and receivers 445. In some cases, the second driver 440 and the receivers 445 may be similarly configured to and operate similarly as the first driver 425 and receivers 430. For example, the receivers 445 may include a set of receivers configured for multi-level signaling and a set of receivers configured for binary signaling.

In some cases, the memory system 400 may operate using terminated transmission lines. For instance, data communicated over the channels 415 may be sent using high-bandwidth signaling (e.g., having a bandwidth parameter that satisfies a threshold), and may be modulated according to a multi-level modulation scheme that supports increased bandwidth transmissions, such as PAM4 signaling. In such cases, the channel 415 used for transmitting the data may be actively terminated, where terminated lines may be used to reduce interference from signals transmitted on a channel 415. The channel 415 may include components that match the characteristic impedance of a conductive line corresponding to the channel 415, which may prevent signals from reflecting back towards a transmitting device and causing interference. The channel 415 may be maintained at the voltage level of the termination and actively driven, for example, at low-level ('0') or high-level ('1').

In some aspects, it may be desirable to transmit signals over the channels 415 using different types of signaling. For example, the memory system 400 may not always need to transmit high-bandwidth signaling. The memory system 400 may instead operate in a low-speed (and low-power) mode associated with signaling having a bandwidth parameter below a threshold, such as binary-level (e.g., NRZ) signaling. In some cases, the use of the binary-level signaling may be associated with unterminated transmission lines. For example, to achieve minimal power consumption (e.g., power consumption below a threshold), additional current used in actively terminating a channel may be avoided through the use of unterminated transmission lines. Further, binary-level signaling may inherently provide for larger data eyes such that an active termination may be unnecessary. The binary-level signaling may likewise correspond to operations in a device when not running computationally intensive operations that are associated with high-bandwidth operations.

A system may thus benefit from the throughput provided by multi-level signaling, while also gaining the advantages of reduced power consumption provided by binary-level signaling. As an illustrative example, the memory system 400 may be a component of a laptop computer. When the computer is powered up there may not be any computationally intensive applications running that utilize high-speed access operations by the memory system 400. For instance, an operating system and web browser application may not place a significant demand on the memory system 400, and any access operations performed may utilize signaling that supports minimal power consumption and extended battery life of the computer (e.g., NRZ signaling). At a later time, a user may open an application that renders 3D graphics in real time, such as a 3D video game, which may place an increased computational demand on the memory system 400. Higher bandwidth operations over the channels 415 may be used, and the memory system 400 may dynamically switch to a different type of signaling that supports such high-speed operations.

As a result, and as disclosed herein, it may be desirable to provide an unterminated operation mode for binary signaling within a system that utilizes multi-level signaling. The unterminated mode may enable decreased power consumption by the memory system 400 since the overhead of a termination current and a current used to create, for example intermediate PAM4 levels, may be avoided. In some cases, a receiver system may be partitioned into multiple types of receivers. For example, one part may be configured for small-swing PAM4 signaling with three different reference levels in a high-performance mode. Another part may be configured for NRZ signaling in a low-performance mode. Through the use of different modes, the devices in the memory system 400 may be able to differentiate between different types of signals used to communicate over the channel 415. Further, the different types of receivers of the receiver system may be separately adjusted. For instance, a set of receivers associated with PAM4 signaling may be adjusted for speed and voltage sensitivity (e.g., using offset calibration techniques), where a set of receivers associated with NRZ signaling may be adjusted for reduced power consumption.

In some cases, the external memory controller 405 may decide to switch between different modes for different signaling (and different termination states of a channel 415) based on some system-level information (e.g., such as a bandwidth of an access operation, a set of applications running). The external memory controller 405 may use the information to determine which mode to use for an access operation. The external memory controller 405 may also program a register bit to indicate, to the memory device 410, the determined mode used for the access operation. In such cases, the external memory controller 405 may accordingly transmit, to the memory device 410, a command indicating the access operation and may also send the programmed register bit that indicates the mode (and signaling) used for the access operation.

Upon receiving the indication of the access command, the memory device 410 may read the register bit to determine the mode. For instance, the register bit may indicate a first mode (e.g., a high-performance mode using PAM4 signaling) and, if currently operating in a second mode (e.g., a low-performance mode using NRZ signaling), the memory device 410 may switch to the first mode and enable a corresponding set of receivers that are configured to receive the signaling associated with the first mode (e.g., PAM4). The register bit may enable the memory device 410 to transmit enable signaling to the receivers 445 that enables the set of receivers configured for receiving signaling based on the indicated mode. In some aspects, switches between different modes may occur relatively infrequently. As such, the external memory controller 405 may determine to use a particular mode and perform one or multiple access operations using the same mode for a period of time. Thus, the register bit may be signaled less frequently than a command to perform an access operation.

The enabling of receivers may be performed by the device receiving data during an access operation. As an example, the external memory controller may not have an ability to directly enable receivers of the memory device 410 (e.g., the external memory controller 405 may not know which receivers 445 of the memory device 410 to enable for an access operation). Instead, the external memory controller 405 may determine that it wants to, for example, write data to the memory device 410 or read data from the memory device 410. As such, the memory device may determine which receivers 445 to enable when it will be receiving data. The register bit that indicates that a different mode is to be used may inform the memory device 410 which set of receivers 445 to enable based on a mode to be used for an access operation. As such, the memory device may enable a particular receiver path based on the register bit and in response to receiving a write/access command.

In some cases, the external memory controller 405 may program the register bit for itself. For instance, the register bit may be stored at the external memory controller 405 to indicate when modes are switching and to change, for example, the signaling type used by the first driver 425 (e.g., for write operations) or the set of receivers 430 (e.g., for read operations), or both. The register bit may be stored in a mode register of the external memory controller 405 and may indicate a current mode of operations within the memory system 400.

In some cases, a particular mode and the corresponding set of receivers may be enabled by default. For instance, a low-performance mode using receives configured for NRZ signaling may be a default mode in the memory system 400. Thus, when the high-performance mode is enabled by the external memory controller 405, the low-performance mode (and corresponding receivers) may be disabled in favor of a set of receivers configured for PAM4 signaling. In other examples, the high-performance mode may be enabled by default. In any event, one set of receivers may be enabled at a time, and when a first mode is being used to receive a first signaling type, a set of receivers associated with a second mode (and a different type of signaling) may be deactivated to conserve power. Alternatively, both modes may be simultaneously deactivated in the memory system 400, where the different sets of receivers may not be enabled. For example, in cases where the memory device 410 is driving data to the controller using second driver 440 (e.g., during a read operation), the receivers 445 may be deactivated to conserve power at the memory device 410.

Figure 5:
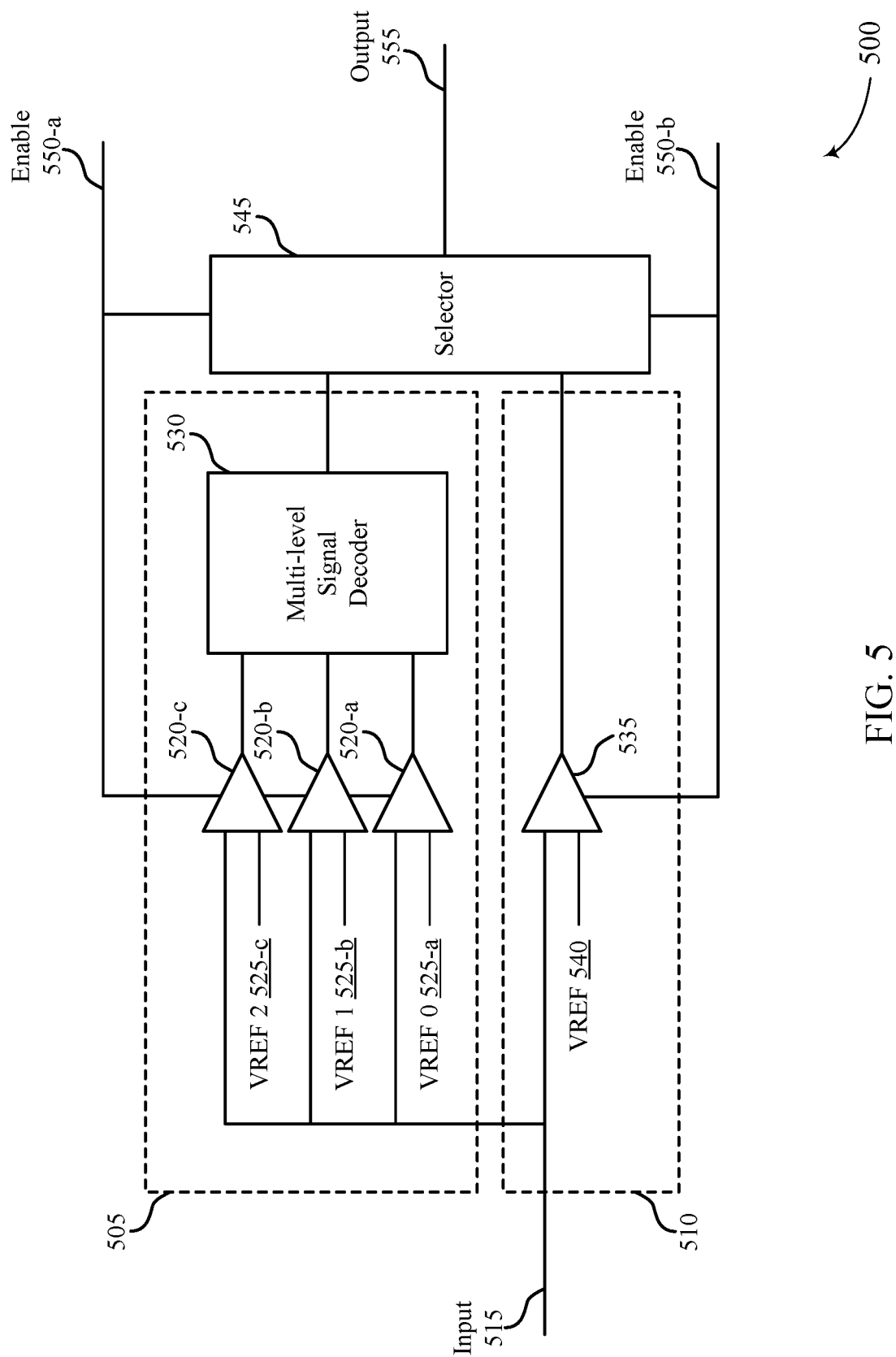
FIG. 5 illustrates an example of a receiver system that supports a multi-level receiver with a termination-off mode as described herein.

FIG. 5 illustrates an example of a receiver system 500 that supports a multi-level receiver with a termination-off mode as disclosed herein. The receiver system 500 may be included in a device, such as a controller (e.g., external memory controller 105, device memory controller 155, local memory controller 165, local memory controller 260, or a combination thereof) or a memory device (e.g., memory device 110), or its components as described with reference to FIGS. 1-4. For example, the receiver system 500 may be a component of an external memory controller 405, or a memory device 410, or both, as described with reference to FIG. 4. The receiver system 500 may support the use of different sets of receivers for respective types of signaling received on a channel.

For example, the receiver system 500 may include a first set of receivers 505 and a second set of receivers 510. In the present example, the first set of receivers 505 may be configured to receive multi-level (e.g., PAM4) signaling via an input 515, and the second set of receivers 510 may be configured to receive binary-level (e.g., NRZ) signaling via the same input 515. That is, the receiver system 500 may be split into two independent branches, where a PAM4 receiver branch may be enabled when a memory system is in a high-performance, high-power PAM4-mode and the NRZ receiver branch may be enabled when the memory system is in low-performance, low-power, NRZ-mode. It is understood, however, that different signaling types (e.g., signals modulated according to different schemes than those described herein) may be used with the receiver system 500, and the examples provided are used for ease of description.

In some examples, the input 515 may be a channel that corresponds to a conductive line, where the receiver system 500 (and the first set of receivers 505 and the second set of receivers 510) may be coupled with the channel to communicate with another device. Additionally, a plurality of receiver systems 500 may be used for parallel channels in a memory device. For instance, if 32 data lines are present in a device, the receiver system 500 may be used on each of the 32 data lines.

The first set of receivers 505 may include multiple receivers 520 that are configured to distinguish between different voltage levels of any multi-level signals received via the input 515. Each receiver 520 of the first set of receivers 505 may use a minimum voltage difference (with respect to a reference voltage 525) to distinguish whether a particular input signal is higher or lower than the reference voltage 525. For example, a first receiver 520-*a* of the first set of receivers 505 may utilize a first reference voltage 525-*a* (VREF 0) to distinguish whether part of a received multi-level signal is higher or lower than VREF 0, a second receiver may utilize a second reference voltage 525-*b* (VREF 1) to distinguish whether part of a received multi-level signal is higher or lower than VREF 1, and so forth.

The first set of receivers 505 may include circuitry to decode the output of the receivers 520. For example, a multi-level signal decoder 530 may receive the output of the receivers 520 each operating with a different reference voltage 525 and output an output code. As the present example illustrates a modulation scheme having four levels, the three receivers 520 may evaluate, for example, three distinct data eyes for four different voltage levels (e.g., corresponding to '00', '01', '10', and '11'). As such, the multi-level signal decoder 530 may decode the output of the receivers 520 into a 2-bit output code based on the received signal.

The second set of receivers 510 may also include one or more receivers 535 used to distinguish whether a received signal is higher or lower than a reference voltage 540. For instance, the second set of receivers 510 may be configured for binary-level signaling and may thus include a receiver 535 that compares a binary signal received via the input 515 to the reference voltage 540 (VREF). In some cases, the reference voltage 540 used in the second set of receivers 510 may be different than the reference voltage(s) 525 used in the first set of receivers 505.

In some cases, selection between the different operational modes that correspond to the first set of receivers 505 and the second set of receivers 510 may be enabled by signals transmitted within the receiver system 500. For example, a first mode that corresponds to multi-level signaling may be used for an access operation, and a signal indicating the first mode (e.g., enable_PAM4) may be received at a selector 545 via a first enable line 550-*a*. In such cases, the selector 545 may determine that the first mode is to be used for an access operation, and may accordingly enable the receivers 520-*a*, 520-*b*, and 520-*c* of the first set of receivers 505 to receive a multi-level signal via the input 515. Additionally or alternatively, a second mode corresponding to binary-level signaling may be used for another access operation. As such, signaling indicating the second mode (e.g., enable NRZ) may be received at the selector 545 via a second enable line 550-*b*. The selector 545 may therefore enable the receiver 535 of the second set of receivers 510 to receive binary-level signaling via the input 515. In some cases, one set of receivers may be enabled at a time. For instance, if the first set of receivers 505 is enabled, then the second set of receivers 510 may be disabled, which may reduce power consumption of the receiver system 500.

In some aspects, the signals sent via the enable lines 550 may be controlled by a value of a bit (e.g., a mode register bit), which may be stored at the device implementing the receiver system 500. In some cases, the bit may be programmed by a controller, such as an external memory controller 105. In such cases, the bit may indicate whether a first mode or a second mode are to be used for a corresponding access operation.

In any event, the selector 545 may receive the signals output from either the first set of receivers 505 or the second set of receivers 510 (based on which set of receivers was enabled for an access operation) and may transmit the signal via an output 555. For instance, the receiver system 500 may be implemented in a memory device 110, and data transmitted as part of a write operation may be received through a receiver path corresponding to the first set of receivers 505 or the second set of receivers 510, and may be subsequently sent to one or more memory cells via the output 555.

Figure 6:
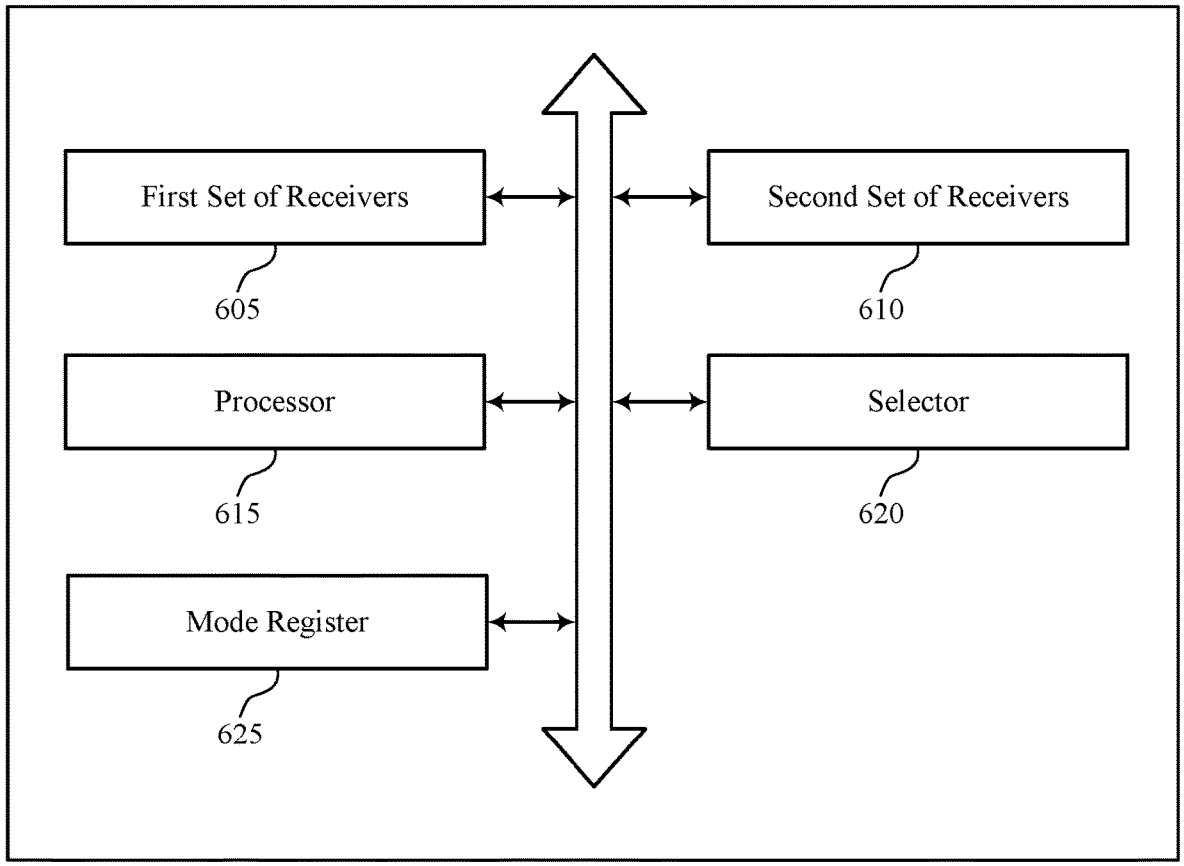
FIG. 6 illustrates a device that supports a multi-level receiver with a termination-off mode as described herein.

FIG. 6 illustrates a block diagram of a device 600 that supports a multi-level receiver with a termination-off mode as disclosed herein. The functions of the device 600 may be performed by a controller (e.g., external memory controller 105, device memory controller 155, local memory controller 165, local memory controller 260, external memory controller 405) as described with reference to FIGS. 1-4. Additionally or alternatively, the functions of the device 600 may be performed by a memory device (e.g., memory device 110, memory device 410) as described with reference to FIGS. 1-4. The device 600 may include a first set of receivers 605, a second set of receivers 610, a processor 615, a selector 620, and a mode register 625. Each of these modules may communicate, directly or indirectly, with one another (e.g., via one or more buses).

The first set of receivers 605 may be coupled with a channel for a memory device and configured to receive (e.g., from a memory device or a controller) a first signal modulated according to a first scheme that includes three or more levels (such as PAM4 signaling). The second set of receivers 610 may be coupled with the channel and configured to receive a second signal (e.g., from the memory device or the controller) according to a second scheme that includes two levels (such as NRZ signaling). That is, different sets of receivers of the device 600 may be coupled to a same input (e.g., conductive line corresponding to a channel), and each set of receivers may be configured to receive a respective type of signaling. In some cases, the first set of receivers 605 may be used when the channel is actively terminated and the second set of receivers 610 may be used when the channel is not actively terminated, where the device 600 may dynamically switch between different modes that utilizes the respective sets of receivers.

In some examples, the first set of receivers 605 may be configured to perform a calibration of an offset associated with a reference voltage. For instance, a receiver's circuitry may comprise a complimentary metal-oxide-semiconductor (CMOS) transistor that compares a received signal to a reference voltage (e.g., similar to a differential amplifier). Although CMOS transistors may be manufactured to be identical, the inherent characteristics and behavior of individual CMOS transistors may vary (an effect that may be referred to as Monte-Carlo variation). As such, one or more receivers of the first set of receivers 605 may experience variation in the sensed voltage level of received signals, which may be based on the area of the CMOS transistor. This variation may result in an offset from a reference voltage (e.g., a reference voltage 340 as described with reference to FIG. 3A) that affects the receiver's ability to determine whether a signal is above or below the reference voltage. However, a calibration procedure may be performed for the first set of receivers 605 to compensate for the offset caused by the inherent variation produced by receiver circuitry. For example, calibration signals may be driven on the channel to enable the device 600 to detect an offset associated with a reference voltage used by each of the first set of receivers 605. The offset may then be compensated for (e.g., canceled), for example, by modifying the associated reference voltage, or modifying some other characteristic of the receiver circuitry. An access operation may subsequently be performed using a reference voltage level for detecting data received over the channel that is based, at least in part, on the calibration.

Additionally, the second set of receivers 610 may be configured to enable power usage by the apparatus below a threshold. Because the second signal and the second set of receivers 610 may be utilized in low-power operations at the device 600 (such as when computationally intensive operations are not being performed by the device 600), the second set of receivers may be adjusted for minimal power usage. As a result, and due to the use of respective sets of receivers that may be separately configured, the resolution and reliability of detecting the value of received signals using the first set of receivers 605 may be enhanced though an offset calibration (or other procedures), while the second set of receivers 610 may be adjusted for power consumption, thereby enhancing the performance and efficiency of the device 600.

The processor 615 may be configured to determine whether to use a first mode for receiving the first signal or a second mode for receiving the second signal. For instance, the device 600 may communicate with another device using the first signal, and the processor 615 may accordingly determine to use the first mode (and the first set of receivers 605) for receiving the first signal from the other device. Additionally or alternatively, the second signal may be used for the access operation, and the processor 615 may determine to use the second mode (and the second set of receivers 610) for receiving the second signal.

In some examples, the processor 615 may be configured to receive a command to execute an access operation and receive an indication (e.g., a mode register bit) to use the first mode or the second mode for the access operation. In some cases, the processor 615 may be configured to transmit, to the first set of receivers 605 or the second set of receivers 610, a signal that enables the first set of receivers 605 or the second set of receivers 610 based on the command and the indication. In such cases, the signal may enable respective types of signaling (e.g., PAM4 or NRZ signaling) to be received over the channel using the corresponding set of receivers. The processor 615 may be configured to determine that the access operation has a transfer rate of data that satisfies a threshold and determine whether to use the first mode or the second mode based on the access operation having the transfer rate of data that satisfies the threshold. As an example, for high-speed access operations (e.g., read and write operations associated with 3D graphics rendering), the first mode may be selected, whereas for other access operations (such as when the device 600 is not performing computationally intensive tasks), the second mode may be selected.

The selector 620 may be configured to select the first set of receivers or the second set of receivers for an access operation based on a determination to use the first mode for receiving the first signal or the second mode for receiving the second signal. In some cases, the selector may be configured to select the first set of receivers or the second set of receivers according to a bit (e.g., a stored mode register bit), where the selection may include enabling either the first set of receivers 605 or the second set of receivers 610 based on the type of signaling to be received for the access operation.

The mode register 625 may be coupled with the processor 615 and configured to receive (e.g., from a controller or another device) a bit that indicates the first mode or the second mode. For example, the device 600 may be an example of a memory device and a controller may provide the memory device with a register bit when a mode has changed for an access operation (e.g., with respect to a previous access operation), where the memory device may according enable a set of receivers based on the register bit.

Additionally or alternatively, the mode register 625 may be configured to store a bit that indicates use of the first mode or the second mode, where storing the bit is based on the determination to use the first mode or the second mode. For instance, the device 600 may be an example of a controller, and may determine that the first mode is to be used for a write operation. As such, the device 600 may store a bit in a mode register indicating that first signaling is to be received from a memory device over the channel in accordance with the first mode.

Figure 7:
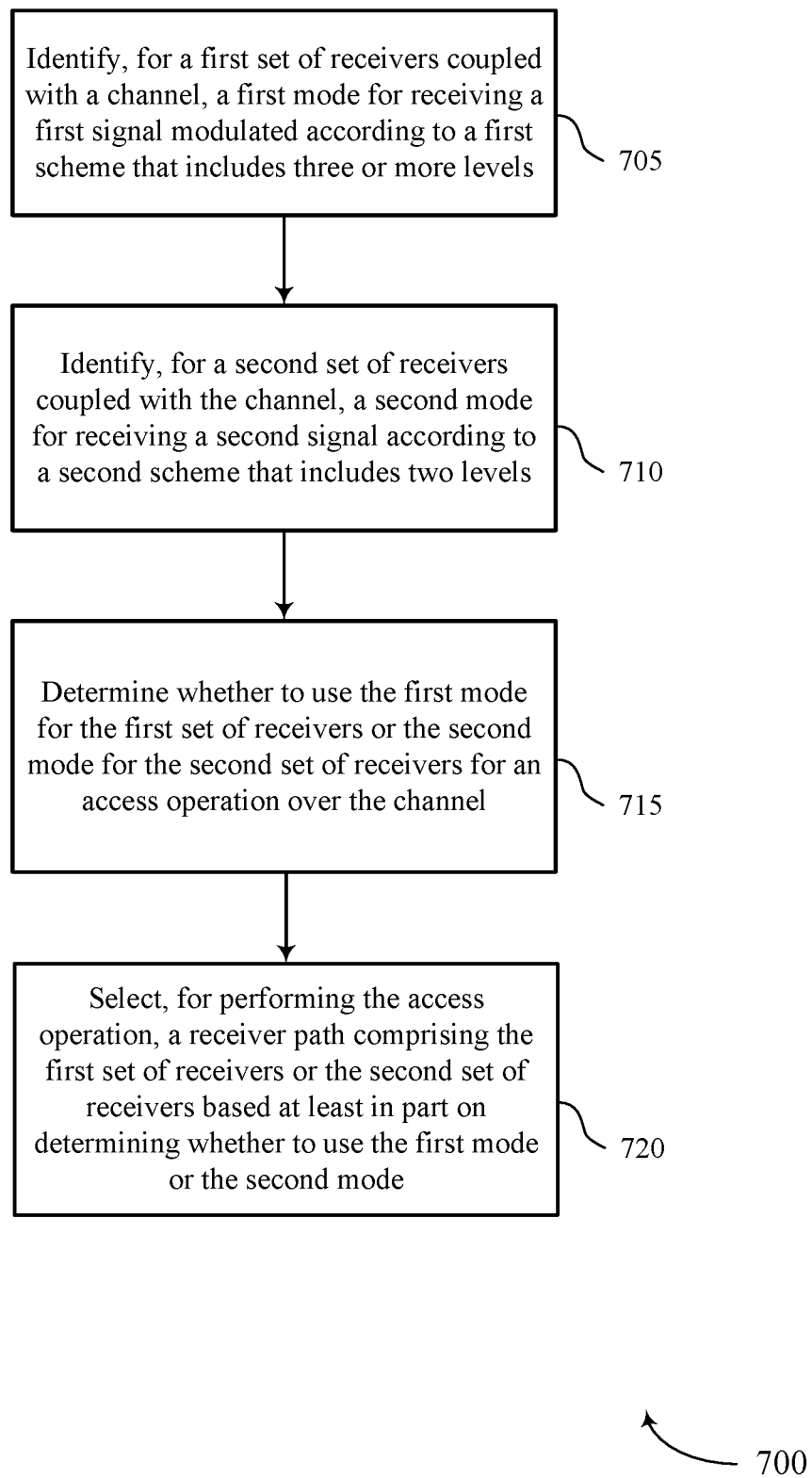
FIG. 7 show a flowchart illustrating a method or methods that support a multi-level receiver with a termination-off mode as described herein.

FIG. 7 shows a flowchart illustrating a method 700 that supports a multi-level receiver with a termination-off mode as disclosed herein. The operations of method 700 may be implemented by a device, such as a controller (e.g., external memory controller 105, device memory controller 155, local memory controller 165, local memory controller 260, or a combination thereof) or a memory device (e.g., memory device 110), or its components as described with reference to FIGS. 1-6. For example, the operations of method 700 may be performed by an external memory controller 405 or a memory device 410 as described with reference to FIG. 4. A device may execute a set of instructions to control the functional elements of the device to perform the functions described herein. Additionally or alternatively, a device may perform aspects of the functions described herein using special-purpose hardware.

At 705 the device may identify, for a first set of receivers coupled with a channel, a first mode for receiving a first signal modulated according to a first scheme that includes three or more levels. For instance, the first signal may comprise PAM4 signaling, and the first set of receivers may include receivers configured to receive the PAM4 signaling over the channel. The operations of 705 may be performed according to the methods described with reference to FIGS. 1-6.

At 710 the device may identify, for a second set of receivers coupled with the channel, a second mode for receiving a second signal according to a second scheme that includes two levels. That is, the second set of receivers may be configured to receive a different type of signaling than the first set of receivers in accordance with the second mode. For example, the second set of receivers may include one or more receivers configured to receive NRZ signaling over the channel. The operations of 710 may be performed according to the methods described with reference to FIGS. 1-6.

At 715 the device may determine whether to use the first mode for the first set of receivers or the second mode for the second set of receivers for an access operation over the channel. The determination may be based on the type of signaling to be utilized in the access operation, where the first mode may be used to receive, for example, PAM4 signaling. Additionally, the second mode may be used to receive NRZ signaling. In any case, the device may use an indication (such as a bit stored in a mode register) to determine which type of signaling may be received over the channel for the access operation, and the device may accordingly determine the corresponding mode to use. The operations of 715 may be performed according to the methods described with reference to FIGS. 1-6.

At 720 the device may select, for performing the access operation, a receiver path comprising the first set of receivers or the second set of receivers based on determining whether to use the first mode or the second mode. The receiver path may include the first set of receivers or the second set of receivers, and the selection may be made such that one set of receivers is used for the access operation based on the type of signaling utilized. The operations of 720 may be performed according to the methods described with reference to FIGS. 1-6.

In some examples, an apparatus or device as described herein may perform a method or methods, such as the method 700. The apparatus or device may include features, means, or instructions (e.g., a non-transitory computer-readable medium storing instructions executable by a processor) for identifying, for a first set of receivers coupled with a channel, a first mode for receiving a first signal modulated according to a first scheme that includes three or more levels, identifying, for a second set of receivers coupled with the channel, a second mode for receiving a second signal according to a second scheme that includes two levels, determining whether to use the first mode for the first set of receivers or the second mode for the second set of receivers for an access operation over the channel, and selecting, for performing the access operation, a receiver path including the first set of receivers or the second set of receivers based on determining whether to use the first mode or the second mode.

Some examples of the method 700, apparatuses, and non-transitory computer-readable medium described herein may further include operations, features, means, or instructions for receiving a command to execute the access operation over the channel, receiving a bit indicating to use the first mode or the second mode for the access operation, where determining whether to use the first mode or the second mode may be based on the bit and enabling the first set of receivers using a first enable signal or the second set of receivers using a second enable signal, where the first enable signal and the second enable signal may be based on the bit.

Some examples of the method 700, apparatuses, and non-transitory computer-readable medium described herein may further include operations, features, means, or instructions for receiving a command to execute the access operation over the channel, identifying, based on receiving the command, an indication to use the first mode or the second mode for the access operation, where determining whether to use the first mode or the second mode may be based on the indication and enabling the first set of receivers or the second set of receivers based on the indication.

In some examples of the method 700, apparatuses, and non-transitory computer-readable medium described herein, the indication includes a setting of a mode register bit. Some examples of the method 700, apparatuses, and non-transitory computer-readable medium described herein may further include operations, features, means, or instructions for storing a bit to use the first mode or the second mode based on the determination to use the first mode or the second mode and transmitting, to a memory device, the bit indicating to use the first mode or the second mode.

Some examples of the method 700, apparatuses, and non-transitory computer-readable medium described herein may further include operations, features, means, or instructions for receiving, based on selecting the receiver path including the first set of receivers or the second set of receivers, the first signal using the first set of receivers or the second signal using the second set of receivers. Some examples of the method 700, apparatuses, and non-transitory computer-readable medium described herein may further include operations, features, means, or instructions for determining to use the first mode or the second mode based on a bandwidth parameter associated with the access operation, where the first signal or the second signal may be based on the bandwidth parameter.

Some examples of the method 700, apparatuses, and non-transitory computer-readable medium described herein may further include operations, features, means, or instructions for enabling the second set of receivers based on determining to use the second mode for the access operation and refraining from enabling the first set of receivers based on determining to use the second mode for the access operation and enabling the second set of receivers. Some examples of the method 700, apparatuses, and non-transitory computer-readable medium described herein may further include operations, features, means, or instructions for performing an offset calibration for each of the first set of receivers based on determining to use the first mode, where the access operation may be based on performing the offset calibration for each of the first set of receivers.

Some examples of the method 700, apparatuses, and non-transitory computer-readable medium described herein may further include operations, features, means, or instructions for determining a configuration associated with power used by each of the second set of receivers that may be below a threshold based on using the second mode, where the access operation may be based on determining the configuration. Some examples of the method 700, apparatuses, and non-transitory computer-readable medium described herein may further include operations, features, means, or instructions for performing the access operation based on selecting the receiver path including the first set of receivers or the second set of receivers.

In some examples of the method 700, apparatuses, and non-transitory computer-readable medium described herein, the first mode may be associated with access operations having a transfer rate of data that satisfies a threshold, and where the second mode may be associated with access operations having a transfer rate of data below the threshold. In some examples of the method 700, apparatuses, and non-transitory computer-readable medium described herein, the first signal corresponds to an active termination of the channel, and where the second signal corresponds to the channel being non-terminated.

In some examples, an apparatus or device may perform aspects of the functions described herein. The apparatus or device may include a first set of receivers coupled with a channel and configured to receive a first signal modulated according to a first scheme that includes three or more levels and a second set of receivers coupled with the channel and configured to receive a second signal according to a second scheme that includes two levels. The apparatus or device may include a processor configured to determine whether to use a first mode for receiving the first signal or a second mode for receiving the second signal and a selector configured to select the first set of receivers or the second set of receivers for an access operation based on a determination to use the first mode for receiving the first signal or the second mode for receiving the second signal.

In some examples, the processor may be configured to receive a command to execute the access operation and an indication to use the first mode or the second mode for the access operation, and transmit, to the first set of receivers or the second set of receivers, a signal that enables the first set of receivers or the second set of receivers based on the command and the indication.

In some examples, the apparatus or device may include a mode register coupled with the processor and configured to receive, from a controller, a bit that indicates the first mode or the second mode, where the selector is configured to select the first set of receivers or the second set of receivers according to the bit. The apparatus or device may include a mode register coupled with the processor and configured to store a bit that indicates use of the first mode or the second mode, where storing the bit is based on the determination to use the first mode or the second mode.

In some cases, the processor may be configured to determine that the access operation has a transfer rate of data that satisfies a threshold and determine whether to use the first mode or the second mode based on the access operation having the transfer rate of data that satisfies the threshold. In some examples, the first set of receivers are configured to perform a calibration of an offset between a reference voltage and first voltage for the first signal, and where the access operation is performed using a voltage level for detecting data received over the channel based on the calibration. In some examples, the second set of receivers are configured to enable power usage by the apparatus below a threshold.

In some examples, an apparatus or device may perform aspects of the functions described herein using general, or special-purpose hardware. For example, an apparatus or device may include a first set of receivers, a second set of receivers, and a channel for a memory device coupled with the first set of receivers and the second set of receivers. In some cases, the apparatus or device may include a controller coupled with the first set of receivers, the second set of receivers, and the channel. In some cases, the controller may be operable to cause the apparatus or device to receive, over the channel, a command to execute an access operation at the memory device, determine, based on the command, whether to use a first mode for receiving a first signal modulated according to a first scheme that includes three or more levels using the first set of receivers or a second mode for receiving a second signal according to a second scheme that includes two levels using the second set of receivers, and enable the first set of receivers for the access operation at the memory device based on a determination to use the first mode.

In some examples, the controller is further operable to cause the apparatus to receive a bit indicating to use the first mode for the access operation. In some cases, the controller is further operable to cause the apparatus to store an indication to use the first mode based on the determination to use the first mode and transmit a signal that enables the first set of receivers for the access operation based on the indication.

In some examples, the controller is further operable to cause the apparatus to perform a calibration of an offset between a reference voltage and a second voltage for each of the first set of receivers based on using the first mode for the access operation. In some examples, the controller is further operable to cause the apparatus to refrain from enabling the second set of receivers based on the first set of receivers being enabled.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure, each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first receiver coupled with a channel for a memory device and configured to:
   receive, from the memory device via the channel, a first signal modulated according to a first scheme that includes two levels; and
   generate a first output based at least in part on a first comparison of a voltage of the first signal to a first reference voltage; and
a set of receivers comprising a second receiver and a third receiver, the set of receivers coupled with the channel and configured to:
   receive, from the memory device via the channel, a second signal modulated according to a second scheme that includes three or more levels;
   generate, at the second receiver, a second output based at least in part on a second comparison of a voltage of the second signal to a second reference voltage; and
   generate, at the third receiver, a third output based at least in part on a third comparison of the voltage of the second signal to a third reference voltage.

2. The apparatus of claim 1, wherein the first output indicates that the first signal corresponds to a first level of the two levels or a second level of the two levels based at least in part on the voltage of the first signal being less than the first reference voltage.

3. The apparatus of claim 1, wherein:
the second output indicates whether the voltage of the second signal is less than the second reference voltage; and
the third output indicates whether the voltage of the second signal is less than the third reference voltage.

4. The apparatus of claim 3, further comprising:
a decoder configured to determine whether the voltage of the second signal corresponds to a first level of the three or more levels, a second level of the three or more levels, or a third level of the three or more levels based at least in part on the second output and the third output.

5. The apparatus of claim 3, wherein the first comparison is based at least in part on a first minimum voltage difference between the voltage of the first signal and the first reference voltage, the second comparison is based at least in part on a second minimum voltage difference between the voltage of the second signal and the second reference voltage, and the third comparison is based at least in part on a third minimum voltage difference between the voltage of the second signal and the third reference voltage.

6. The apparatus of claim 1, further comprising:
a processor configured to determine whether to use a first mode for receiving the first signal or a second mode for receiving the second signal; and
a selector configured to select the first receiver or the set of receivers for an access operation at the memory device based at least in part on a determination to use the first mode for receiving the first signal or the second mode for receiving the second signal.

7. The apparatus of claim 6, wherein the processor is configured to:
receive a command to execute the access operation and an indication to use the first mode or the second mode for the access operation; and
transmit, to the first receiver or the set of receivers, a signal that enables the first receiver or the set of receivers based at least in part on the command and the indication.

8. The apparatus of claim 6, wherein the processor is configured to:
determine that the access operation has a transfer rate of data that satisfies a threshold; and
determine whether to use the first mode or the second mode based at least in part on the access operation having the transfer rate of data that satisfies the threshold.

9. The apparatus of claim 6 further comprising:
a mode register coupled with the processor and configured to receive, from a controller, a bit that indicates the first mode or the second mode, wherein the selector is configured to select the first receiver or the set of receivers according to the bit.

10. The apparatus of claim 6, further comprising:
a mode register coupled with the processor and configured to store a bit that indicates use of the first mode or the second mode, wherein storing the bit is based at least in part on the determination to use the first mode or the second mode.

11. The apparatus of claim 1, wherein
the first signal corresponds to an active termination of the channel, and
the second signal corresponds to the channel being non-terminated.

12. The apparatus of claim 1, wherein:
the second scheme includes four levels,
the set of receivers comprises a fourth receiver, and
the set of receivers is configured to generate, at the fourth receiver, a fourth output based at least in part on a fourth comparison of the voltage of the second signal to a fourth reference voltage.

13. The apparatus of claim 12, wherein the fourth output indicates whether the voltage of the second signal is less than the third reference voltage.

14. The apparatus of claim 13, further comprising:
a decoder configured to determine whether the voltage of the second signal corresponds to a first level of the four levels, a second level of the four levels, a third level of the four levels, or a fourth level of the four levels based at least in part on the second output, the third output, and the fourth output.

15. A method, comprising:
receiving, at a first receiver from a memory device via a channel, a first signal modulated according to a first scheme that includes two levels;
generating, at the first receiver, a first output based at least in part on a first comparison of a voltage of the first signal to a first reference voltage;
receiving, at a set of receivers comprising a second receiver and a third receiver from the memory device via the channel, a second signal modulated according to a second scheme that includes three or more levels;
generating at the second receiver, a second output based at least in part on a second comparison of a voltage of the second signal to a second reference voltage; and
generating, at the third receiver, a third output based at least in part on a third comparison of the voltage of the second signal to a third reference voltage.

16. The method of claim 15, wherein the first output indicates that the first signal corresponds to a first level of the two levels or a second level based at least in part on the voltage of the first signal being less than the first reference voltage.

17. The method of claim 15, wherein:
the second output indicates whether the voltage of the second signal is less than the second reference voltage; and
the third output indicates whether the voltage of the second signal is less than the third reference voltage.

18. The method of claim 17, further comprising:
determining whether the voltage of the second signal corresponds to a first level of the three or more levels, a second level of the three or more levels, or a third level of the three or more levels based at least in part on the second output and the third output.

19. The method of claim 15, wherein the first comparison is based at least in part on a first minimum voltage difference between the voltage of the first signal and the first reference voltage, the second comparison is based at least in part on a second minimum voltage difference between the voltage of the second signal and the second reference voltage, and the third comparison is based at least in part on a third minimum voltage difference between the voltage of the second signal and the third reference voltage.

20. An apparatus, comprising:
a first receiver coupled with a channel for a memory device;
a set of receivers comprising a second receiver and a third receiver, the set of receivers coupled with the channel; and
a controller coupled with the first receiver, the set of receivers, and the channel, the controller operable to cause the apparatus to:

receive, at the first receiver from the memory device via the channel, a first signal modulated according to a first scheme that includes two levels;

generate, at the first receiver, a first output based at least in part on a first comparison of a voltage of the first signal to a first reference voltage; and receive, at the set of receivers from the memory device via the channel, a second signal modulated according to a second scheme that includes three or more levels;

generate, at the second receiver, a second output based at least in part on a second comparison of a voltage of the second signal to a second reference voltage; and generate, at the third receiver, a third output based at least in part on a third comparison of the voltage of the second signal to third reference voltage.

* * * * *